US007634303B2

United States Patent
Candidus et al.

(10) Patent No.: US 7,634,303 B2
(45) Date of Patent: Dec. 15, 2009

(54) DIELECTRIC ELEMENT AND METHOD FOR GENERATING A MAGNETIC RESONANCE IMAGE THEREWITH

(75) Inventors: Yvonne Candidus, Tuchenbach (DE); Thorsten Feiweier, Poxdorf (DE); Wilhelm Horger, Schwaig (DE); Jürgen Huber, Erlangen (DE); Razvan Lazar, Erlangen (DE); Melanie Schmitt, Erlangen (DE); Lothar Schön, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 360 days.

(21) Appl. No.: 11/768,531

(22) Filed: Jun. 26, 2007

(65) Prior Publication Data
US 2007/0269383 A1    Nov. 22, 2007

Related U.S. Application Data

(62) Division of application No. 11/095,159, filed on Mar. 31, 2005, now Pat. No. 7,492,156.

(30) Foreign Application Priority Data
Mar. 31, 2004    (DE) .................. 10 2004 015 859

(51) Int. Cl.
A61B 5/05       (2006.01)
G01V 3/00       (2006.01)
B23P 17/04      (2006.01)

(52) U.S. Cl. .................. 600/421; 324/318; 29/592

(58) Field of Classification Search .......... 600/410, 600/420, 421; 324/309, 318; 29/592
See application file for complete search history.

(56) References Cited

U.S. PATENT DOCUMENTS

| 4,719,406 | A |   | 1/1988 | Schaefer et al. |
| 5,087,382 | A | * | 2/1992 | Ishino et al. ............. 252/73 |
| 5,227,727 | A |   | 7/1993 | Segawa et al. |
| 5,284,144 | A |   | 2/1994 | Delannoy et al. |
| 5,987,672 | A | * | 11/1999 | Oosterwaal ............. 5/601 |
| 7,432,713 | B2 | * | 10/2008 | Candidus et al. ........ 324/318 |

FOREIGN PATENT DOCUMENTS

EP    1 219 861    7/2002

OTHER PUBLICATIONS

Klinische Kernspintomographie, 2nd Edition, Lissner et al., Editors (1990) pp. 149-156.
"RF In homogeneity Compensation in Structural Brain Imaging," Deichmann et al., Magnetic Resonance in Medicine, vol. 47 (2002) pp. 398-402.

* cited by examiner

*Primary Examiner*—Eric F Winakur
*Assistant Examiner*—Michael T Rozanski
(74) *Attorney, Agent, or Firm*—Schiff Hardin LLP

(57) ABSTRACT

A dielectric element is formed of a dielectric material exhibiting a magnetic resonance relaxation time, with a relaxation agent incorporated in the dielectric material that reduces the relaxation time of the dielectric material. The dielectric element is adapted for placement on a subject while magnetic resonance data are acquired from the subject, and locally influences the $B_1$ field distribution in the subject during the acquisition of magnetic resonance data.

22 Claims, 1 Drawing Sheet

DIELECTRIC ELEMENT AND METHOD FOR GENERATING A MAGNETIC RESONANCE IMAGE THEREWITH

RELATED APPLICATION

The present application is a divisional of Ser. No. 11/095,159, filed Mar. 31, 2005 now U.S. Pat. No. 7,492,156.

BACKGROUND OF THE INVENTION

1. Field of the Invention

The invention concerns a method for generation of magnetic resonance exposures (images) of an examination subject, in which a dielectric element is positioned on the examination subject for locally influencing the $B_1$ field distribution. The invention also concerns such a dielectric element for positioning on an examination subject for local influencing the $B_1$ field distribution during magnetic resonance data acquisition.

2. Description of the Prior Art

Magnetic resonance tomography has become a widespread modality for acquisition of images of the inside of the body of a living examination subject. In order to acquire an image with this modality, i.e. to generate a magnetic resonance exposure of an examination subject, the body or a body part of the patient to be examined must initially be exposed to an optimally homogenous static basic magnetic field (usually designated as $B_0$ field) that is generated by a basic field magnet of the magnetic resonance measurement device. During the acquisition of the magnetic resonance images, rapidly switched gradient fields that are generated by gradient coils are superimposed on this basic magnetic field for spatially coding the magnetic resonance signal. With a radio-frequency antenna, RF pulses of a defined field strength are radiated into the examination volume in which the examination subject is located. The magnetic flux density of these RF pulses is typically designated with $B_1$. The pulse-shaped radio-frequency field therefore generally is called a $B_1$ field for short. By means of these RF pulses, the nuclear spins of the atoms in the examination subject are excited such that they are displaced from their state of equilibrium, which proceeds parallel to the basic magnetic field $B_0$, by an "excitation flip angle (also called "flip angle" for short in the following). The nuclear spins then precess in the direction of the basic magnetic field $B_0$. The magnetic resonance signals thereby generated are acquired by radio-frequency receiving antennas. The receiving antennas can be the same antennas with which the RF pulses are radiated or separate receiving antennas. The magnetic resonance images of the examination subject are ultimately created based on the received magnetic resonance signals. Every image point in the magnetic resonance image is associated with a small body volume, known as a "voxel", and the brightness or intensity value of each image point is linked with the signal amplitude of the magnetic resonance signal received from this voxel. The connection between a resonant radiated RF pulse with the field strength $B_1$ and the flip angle α achieved with this is given by the equation $$\alpha = \int_{t=0}^{\tau} \gamma \cdot B_1(t) \cdot dt \quad (1)$$

wherein γ is the gyromagnetic ratio, which can be considered as a fixed material constant for most magnetic resonance examinations, and τ is the effective duration of the radio-frequency pulse. The flip angle achieved by an emitted RF pulse, and thus the strength of the magnetic resonance signal, consequently also depend (aside from the duration of the RF pulse) on the strength of the radiated $B_1$ field. Spatial fluctuations in the field strength of the excited $B_1$ field therefore lead to unwanted variations in the received magnetic resonance signal that can adulterate the measurement data.

In the presence of high magnetic field strengths—that are inevitable due to the necessary magnetic basic field $B_0$ in a magnetic resonance tomography apparatus—the RF pulses disadvantageously exhibit an inhomogeneous penetration behavior in conductive and dielectric media such as, for example, tissue. This leads to the $B_1$ field exhibiting significant variation within the measurement volume. Particularly in examinations known as ultra-intense field magnetic resonance examinations, in which modern magnetic resonance systems are used with a basic magnetic field of three Tesla or more, special measures must therefore be taken in order to achieve an optimally homogenous distribution of the transmitted RF field of the radio-frequency antenna in the entire volume.

A simpler but more effective approach to the solution of this problem is to modify the (di-)electric environment of the examination subject in a suitable manner in order to compensate unwanted inhomogeneities. For this purpose, dielectric elements with a defined dielectric constant and conductivity can be positioned in the examination volume, for example directly at the patient or on the patient. The material of these dielectric elements should exhibit an optimally high dielectric constant, preferably $\varepsilon \geq 50$. The dielectric material thus produces a dielectric focusing. The material of the dielectric element, however, should not exhibit a conductivity that is too high because, due to the skin effect, this leads to high eddy currents, in particular in the surface region of the dielectric element, that in turn produce a shielding effect that weakens (attenuates) the dielectric focusing effect. For example, typical RF field minima can be compensated that occur in magnetic resonance examinations of a patient in the chest and abdomen region by placing such dielectric elements on the chest or abdomen, which compensate the minima by locally increasing of the penetrating radio-frequency field. Such a method is specified in U.S. Pat. No. 5,227,727. Moreover, various possibilities are specified therein for the design of suitable dielectric elements.

Distilled water with a dielectric constant of $\varepsilon \approx 80$ and a conductivity of approximately 10 μS/cm and filled into a plastic film pouch can be used to form a simple dielectric element.

Unfortunately, the use of all of these "dielectric pillows" has the unwanted side effect that they are visible in the magnetic resonance exposures. In addition to this, due to fold-over effects the dielectric element may not be imaged within the magnetic resonance exposure at the location at which it is actually positioned in real space. Thus, for example, due to fold-over effects the pillow may be shown at the upper edge of an MR image instead of at the lower edge. This leads to the impression being created when viewing the magnetic resonance exposure that the dielectric element is located not on but rather inside the body of the patient. It is in principle possible to acquire an image by a technique known as oversampling such that the dielectric element is at the correct position. In such a case, the dielectric element can be deleted in the image processing or an image section can be selected which does not even contain the dielectric element at all. Such oversampling methods, however, are quite time-consuming and therefore prolong the measurement time.

SUMMARY OF THE INVENTION

It is an object of the present invention to further develop a method for generation of magnetic resonance exposures using dielectric elements as well as a dielectric element, such that interferences in the magnetic resonance exposures are reduced or even entirely prevented in a simple manner by the positioned dielectric elements.

This object is achieved by a dielectric element and a method employing such a dielectric element wherein the dielectric element includes a relaxation agent that reduces the relaxation time of the dielectric element. Both the $T_1$ relaxation time and the $T_2$ relaxation time are reduced. The reduction can be up to 3 orders of magnitude, depending on the material of the dielectric element used and the relaxation agent. For example, the relaxation time of a conventional dielectric element, without the addition of the relaxation agent, would be on the order of 1 s. This would be lowered to less than 1 ms, for example, by the relaxation agent in accordance with the invention. The relaxation agent consequently ensures that the relaxation times of the diagnostically irrelevant dielectric element are shorter than the typical signal evolution times. This dielectric element thus is practically invisible in most applications, and interference-free data acquisition is possible. Since the inventive dielectric elements are not visible in the images, additional data acquisition time to prevent fold-over artifacts is not necessary. Typical imaging sequences thus can be unchanged in the inventive method and thus can be used without performance losses. Nevertheless, the desired homogenization effect of the $B_1$ field is achieved in a simple manner.

Paramagnetic substances are particularly suitable as relaxation agents. Such substances have been used for a long time in contrast agents (for example, orally or intravenously administered to the patient) for improved representation of specific anatomic structures of a patient, by modifying the magnetic resolution behavior of an organ by shortening the $T_1$ and $T_2$ relaxation times, and thus a specified reduction or addition to the signal intensity is achieved. A specification of such contrast agents is found, for example, in "Klinische Kernspintomographie", ed. J. Lissner and M. Seiderer, 2nd edition, Ferdinand Enke Verlag Stuttgart, 1990, p. 149-156.

The paramagnetic atoms of these substances cause local distortions of the $B_0$ field. This has the same effect as a temporally fluctuating $B_0$ field for a hydrogen atom moving in this locally inhomogeneous field. Insofar as the frequency of the fluctuations exhibits components at the Lamor frequency, these have the effect of promoting relaxation. Examples of such paramagnetic substances are substances that contain one or more of the following chemical elements—at least with oxidation number different than zero: gadolinium, europium, iron, chromium, nickel, copper and/or manganese. These preferably are in the form of complexes, since this simplifies gel formation and minimizes or precludes the risk due to free metal ions, some of which can be toxic.

In a preferred embodiment, the dielectric element has a dielectric filling surrounded by a solid body shell, in particular a water-based filling that contains the relaxation agent. In the case of such a dielectric element in the form of a pillow, the filling of the pillow, which conventionally was simply water, additionally includes a relaxation agent that reduces the relaxation time of the filling, in accordance with the invention.

In principle, every material that is MR-inactive, sufficiently diffusion and compatible with an MR system is suitable for the solid body shell. The solid body shell can be formed from an organic polymer, particularly preferably from soft PVC, polyethylene or polypropylene. A further possibility is to form the solid body shell from a laminate with at least two layers that can be manufactured from one or more organic polymers or a fabric (textile). For example, diffusion-dense interior layer can be combined with a biocompatible (skin compatible) exterior layer. A fabric layer (in particular made from aramid fibers such as, for example, Kevlar®) can be laminated for protection against mechanical damage.

In principle, the filling can be any consistency, for example in liquid form. In a preferred embodiment, the filling that contains the relaxation agent is in the form of a gel, preferably in the form of an aqueous gel. This means that the relaxation agent is then contained in the gel. This has the advantage that the dielectric element substantially retains its outer shape—in particular its thickness—in the magnetic resonance scan measurement, so the intended homogenization effect is achieved. In addition to non-deformability, handling is made easier and the positioning comfort is improved. Such a gel-containing pillow normally is more comfortable during a magnetic resonance scan than a liquid-filled dielectric element that is provided with a rigid shell to ensure the non-deformability. A further advantage of a gel (which, for example, can be contained in a pillow) is that the filling, and thus possibly harmful substances, cannot escape in the event that the shell is damaged.

When a gel is used for the filling, it is particularly advantageous for the paramagnetic substance to be in the form of a complex, since complexes facilitate surface swelling of the gel base while free ions in solution often hinder this, if anything.

If a liquid filling is used in accordance with the invention-compartmentalized shell, for example with webs inside, can be used in order to improve the non-deformability of the dielectric element.

As a gel base, all materials can be used that are toxicologically harmless and are able to form a gel with the desired consistency in the presence of the desired concentration of paramagnetic substance. For example, sodium polyacrylate can be used, which preferably is used in the form of a dry sodium polyacrylate powder that exhibits a particle size of maximum 0.5 mm, preferably under approximately 0.2 mm. Larger particle sizes can lead to the final gel being less homogenous. In general, the smaller the particle size, the more homogeneous the resulting gel. Agarose, polysaccharide, polyacrylic acid, polyvinylpyrrolidone, polyvinylalcohol, polyacrylamide, as well as modified amylum or cellulose, also can be used as the gel base or to adjust a high viscosity.

Radical groups of the acylate monomer forming the base can be substituted (for example by alkyl-, alkoxyl- or hydroxyalkyl groups). Copolymers with, if applicable, substituted acrylamide can also be used.

The gel base generally is present in a concentration of 3-10 weight percent, of the filling preferably approximately 5 weight percent.

The gel can contain a preservative of more than 20 weight percent of the gel, preferably approximately 25 weight percent. Examples of suitable preservatives are 1,2-propanediol, ethanol and 2-propanol.

DESCRIPTION OF THE PREFERRED EMBODIMENTS

Figure 1:
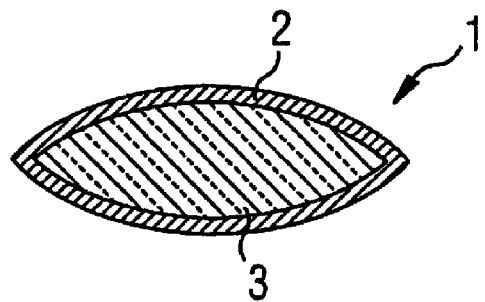
FIG. 1 is a schematic representation of a dielectric pillow in accordance with the invention.

The dielectric element shown in FIG. 1 is a dielectric pillow 1 having an outer shell 2 made from plastic film and a filling 3 that contains a paramagnetic substance. The plastic film of the outer shell 2 is a biocompatible material that is relatively thin but nevertheless sufficiently stable to prevent escape of the filling 3 contained therein. The plastic film of the outer shell 2 is preferably fused all around.

In use, the dielectric pillow 1 can be covered with a washable pillowcase that can be changed before use of the dielectric pillow 1 with different patients. The plastic film of the outer shell 2 can advantageously by disinfected with typical means.

In the exemplary embodiment, the filling 3 is an aqueous sodium polyacrylate gel that incorporates a gadolinium complex as a paramagnetic substance. This special filling 3 has the advantage that it is completely safe for the patient, in addition to the desired properties of effecting homogenization of the transmitted and received RF fields and being invisible in MR images.

Figure 2A:
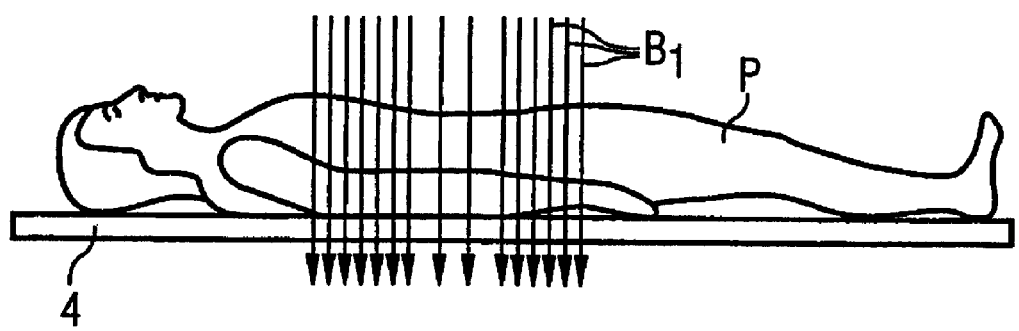
FIG. 2a is a schematic illustration of a patient positioned on a bed, with radiation of a $B_1$ field without a dielectric pillow.
Figure 2B:
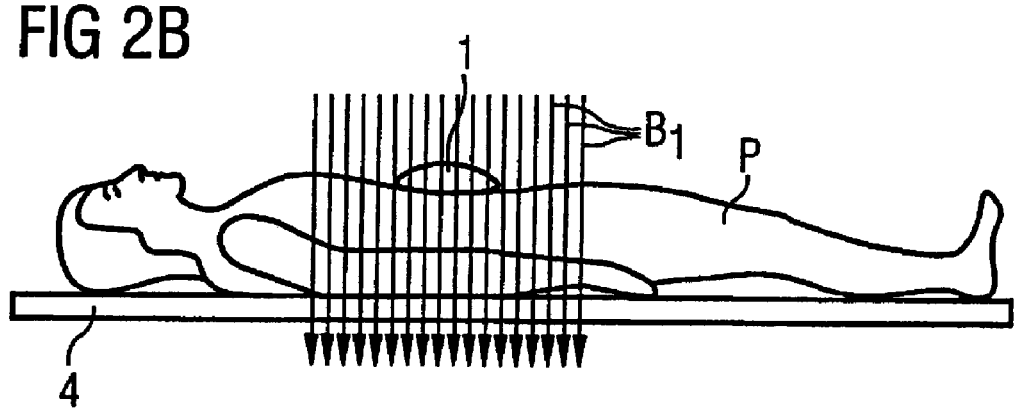
FIG. 2b is a schematic illustration of the patient according to FIG. 2a with radiation of a $B_1$ field, with a dielectric pillow according to FIG. 1 positional on the abdomen of the patient.

The effect of such a dielectric element 1 for homogenization of the $B_1$ field in a magnetic resonance acquisition is schematically shown in FIGS. 2a and 2b.

FIG. 2a shows a patient P located on a patient bed 4 within a magnetic resonance tomography apparatus (not shown). A $B_1$ field, schematically indicated by field lines, is emitted by a radio-frequency antenna of the magnetic resonance tomography apparatus. The density of the field lines $B_1$ represents the strength of the $B_1$ field. A local minimum of the $B_1$ field, which typically occurs under real conditions in the abdomen and chest region of the patient in a magnetic resonance scan, is shown in the abdomen region of the patient P. The field lines are less dense in this region than in the other regions.

This effect is compensated by the application of a dielectric pillow 1 according to FIG. 1 on the abdomen of the patient P. This is schematically shown in FIG. 2b. The dielectric pillow 1 leads to a local increase (intensification) of the $B_1$ field in the region of the pillow 1, so overall the field inhomogeneity is cancelled (compensated), such that a more homogenous $B_1$ field exists than without the dielectric pillow 1.

An example for the production of a filling material suitable for use in the invention is described in the following.

150 g pulverized sodium polyacrylate (obtained from BASF) with a particle size of approximately 0.15 mm was dispersed in 750 g 1,2-propanediol. A solution of 150 g of the methylglucamine (meglumine) salt of the gadopentitic acid (Gd-DTPA) (synthesized in a laboratory) in 1950 ml distilled water was subsequently added to the dispersion under agitation and further agitated. The resulting homogenous gel exhibits the following composition:

| sodium polyacrylate | 5 weight percent |
| Gd-DTPA-meglumine salt | 5 weight percent |
| 1,2-propanediol | 25 weight percent |
| distilled water | 65 weight percent |

This gel was filled into a pillow shell made of polyethylene which was subsequently fused, the pillow geometry being 35 cm×25 cm×4 cm.

When this pillow is used in a magnetic resonance scan as shown in FIG. 2b, the pillow is not visible due to the extremely short relaxation times of the filling material (in the sub-ms range), even in the case of imaging methods with very short signal evolution times (TE approximately 2 ms), for example for generation of $T_1$ contrast images.

Since the dielectric constant of the filling material of the dielectric element is approximately ∈≈50 to 60 and the electrical conductivity is not too high, homogenization of the $B_1$ field is achieved with such a dielectric pillow to the same effect as with the known water pillows.

The filling material described above can likewise be produced by mixing a highly concentrated solution of Gd complex into distilled water together with a mixture composed of 1,2-propanediol and sodium polyacrylate, and then thinning the resulting mixture with distilled water to achieve the final concentration.

A further possibility for production of the filling material is in situ gel formation by radical polymerization of acrylate monomers directly into an aqueous solution in the presence of the desired paramagnetic substance.

The method and the dielectric pillow described above, are only exemplary embodiments that can be modified by those skilled in the art without departing from the scope of the invention. Although the invention has been described in the context of magnetic resonance apparatuses in the medical field as an example, usage of the invention is not limited to this field. The invention also can be used in magnetic resonance apparatuses used for scientific or industrial purposes.

We claim as our invention:

1. A method for generating a magnetic resonance exposure of an examination subject comprising the steps of:
   in a dielectric element including dielectric material having a dielectric constant of at least 50 and exhibiting a relaxation time selected from the group consisting of a $T_1$ relaxation time and a $T_2$ relaxation time, incorporating a relaxation agent, not bound to particles, that reduces said relaxation time;
   positioning said dielectric element on an examination subject; and
   obtaining magnetic resonance data from said subject with said dielectric element placed thereon in a data acquisition sequence that includes generating a $B_1$ field that produces a $B_1$ field distribution in said subject, and said dielectric material with said relaxation agent incorporated therein being configured to exert an influence on said field distribution outside of said dielectric material and in said subject.

2. A method for manufacturing a dielectric element configured for placement on an examination subject during acquisition of magnetic resonance data from the subject in a $B_1$ field having a field distribution in said subject with said dielectric element, said method comprising the steps of:
   in a dielectric material having a dielectric constant of at least 50 and exhibiting a relaxation time selected from the group consisting of a $T_1$ relaxation time and a $T_2$ relaxation time, incorporating a relaxation agent, not bound to particles, that reduces said relaxation time; and fabricating said dielectric material and said relaxation agent incorporated therein into a container adapted for placement on a subject during acquisition of magnetic resonance data from the subject; and wherein said dielectric material with said relaxation agent incorporated therein fills said container and being configured to exert an influence on said field distribution outside of said dielectric material and in said subject.

3. A method as claimed in claim 2 comprising employing a paramagnetic substance as said relaxation agent.

4. A method as claimed in claim 3 comprising forming said paramagnetic substance from at least one element selected from the group of elements consisting of gadolinium, europium, iron, chromium, nickel, copper and manganese.

5. A method as claimed in claim 4 comprising integrating said chemical element into a complex.

6. A method as claimed in claim 3 comprising employing a gadolinium complex as said paramagnetic substance.

7. A method as claimed in claim 2 comprising formulating said dielectric material with said relaxation incorporated therein as a dielectric filling; and surrounding said dielectric filling with said container formed as an outer solid shell.

8. A method as claimed in claim 7 comprising forming said outer solid shell from an organic polymer.

9. A method as claimed in claim 8 comprising selecting said organic polymer from the group consisting of soft PVC, polyethylene and polypropylene.

10. A method as claimed in claim 7 comprising forming said outer solid shell as a laminate of at least two layers.

11. A method as claimed in claim 10 comprising forming at least one of said at least two layers from a material selected from the group consisting of organic polymers and fabrics.

12. A method as claimed in claim 2 comprising incorporating said relaxation agent in said dielectric material by incorporating said relaxation agent in a gel and incorporating said gel in said container, wherein said container comprises a diffusion-resistant covering surrounding said dielectric material.

13. A method as claimed in claim 12 comprising employing an aqueous gel as said gel.

14. A method as claimed in claim 12 comprising employing a gel having a sodium polyacrylate base as said gel.

15. A method as claimed in claim 14 comprising forming said gel having a sodium polyacrylate base from a dry sodium polyacrylate powder having a maximum particle size of 0.5 mm.

16. A method as claimed in claim 14 comprising forming said gel having a sodium polyacrylate base from a dry sodium polyacrylate powder having a maximum particle size of below approximately 0.2 mm.

17. A method as claimed in claim 12 comprising incorporating said gel into said dielectric material in a concentration in a range between 3 and 10 weight percent of said dielectric material with said gel incorporated therein.

18. A method as claimed in claim 12 comprising incorporating said gel into said dielectric material in a concentration of 5 weight percent of said dielectric material with said gel incorporated therein.

19. A method as claimed in claim 12 comprising incorporating a preservative in said gel.

20. A method as claimed in claim 19 comprising incorporating said preservative in said gel in an amount forming more than 20 weight percent of said gel.

21. A method as claimed in claim 19 comprising incorporating said preservative in said gel in an amount forming approximately 25 weight percent of said gel.

22. A method as claimed in claim 19 comprising employing a preservative selected from the group consisting of 1,2-propanediol, ethanol and 2-propanol as said preservative.

* * * * *